United States Patent
Suzuki et al.

(10) Patent No.: US 6,780,795 B2
(45) Date of Patent: Aug. 24, 2004

(54) HEAT TREATMENT APPARATUS FOR PREVENTING AN INITIAL TEMPERATURE DROP WHEN CONSECUTIVELY PROCESSING A PLURALITY OF OBJECTS

(75) Inventors: Fujio Suzuki, Esashi (JP); Hideki Wakai, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 10/385,481

(22) Filed: Mar. 12, 2003

(65) Prior Publication Data

US 2003/0180970 A1 Sep. 25, 2003

(30) Foreign Application Priority Data

Mar. 20, 2002 (JP) ........................................ 2002-078105
Nov. 29, 2002 (JP) ........................................ 2002-348388

(51) Int. Cl.⁷ .......................................... H01L 21/324
(52) U.S. Cl. ...................................... 438/795; 438/758
(58) Field of Search ................................ 438/758, 795

(56) References Cited

U.S. PATENT DOCUMENTS 6,093,252 A * 7/2000 Wengert et al. ............. 118/719

FOREIGN PATENT DOCUMENTS

JP 11074187 3/1999
JP 2000-181549 6/2000

* cited by examiner

Primary Examiner—John F. Niebling
Assistant Examiner—Christopher Lattin
(74) Attorney, Agent, or Firm—Pillsbury Winthrop LLP

(57) ABSTRACT

A temperature drop is be prevented when a plurality of substrates are processed one after another so as to improve a uniformity of process quality between the substrate. An offset temperature value is obtained which is a difference between a temperature of a processing atmosphere at a time immediately before a first one of the substrates is carried into a reaction container and a temperature of the processing atmosphere at a time the temperature has become constant after the substrate are subjected to a heat treatment process one after another. An electric power is supplied to a heater so as to obtain a time period necessary for raising the temperature of a processing atmosphere to a temperature higher than a setting temperature for the heat treatment process by the offset temperature value. The electric power is supplied to the heater for only the obtained time period when the first one of the substrates is carried into the reaction container, and, thereafter, performing an electric power control of the heater based on a temperature detection value of a temperature detecting part provided outside the reaction container.

13 Claims, 10 Drawing Sheets

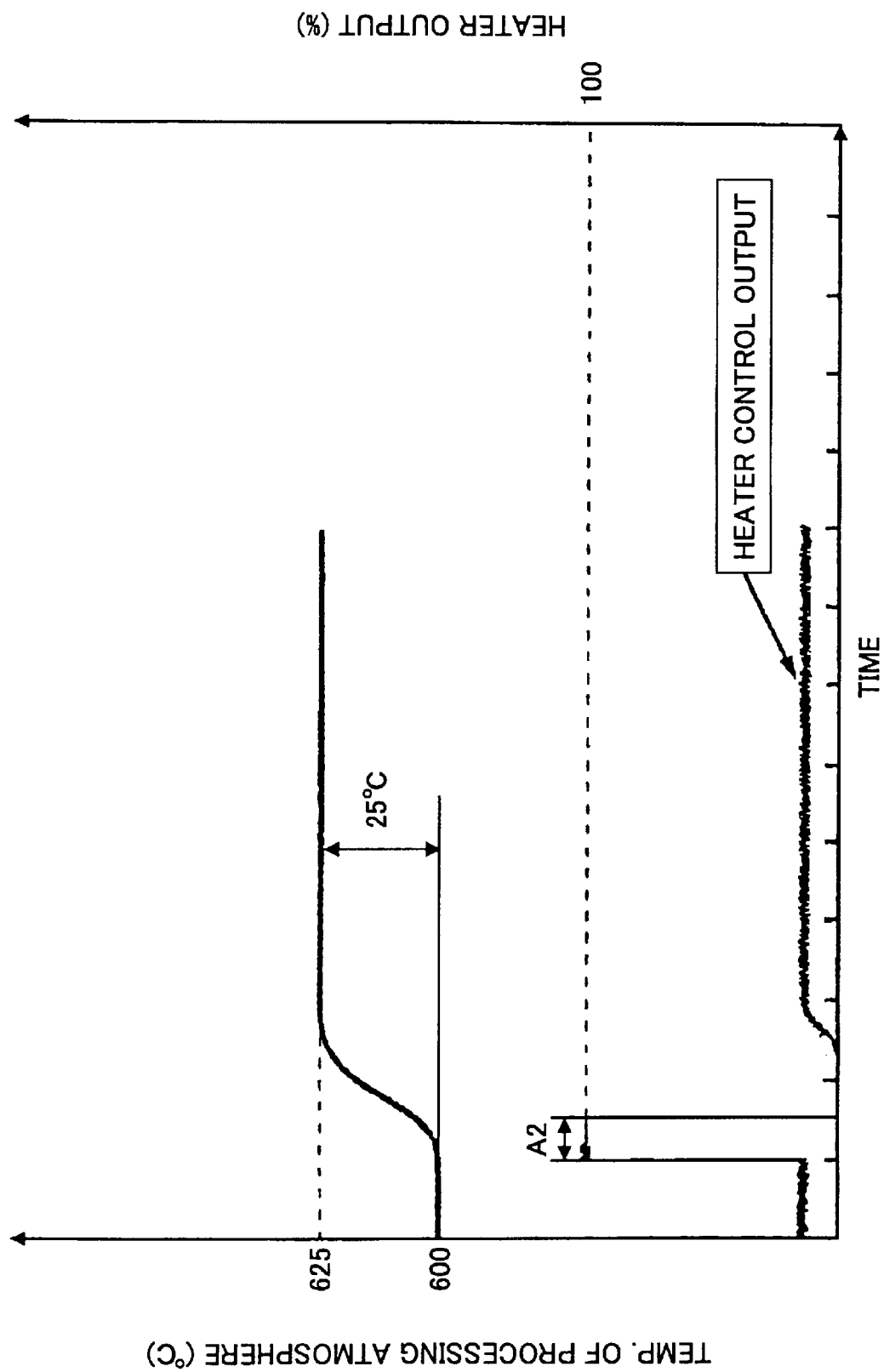

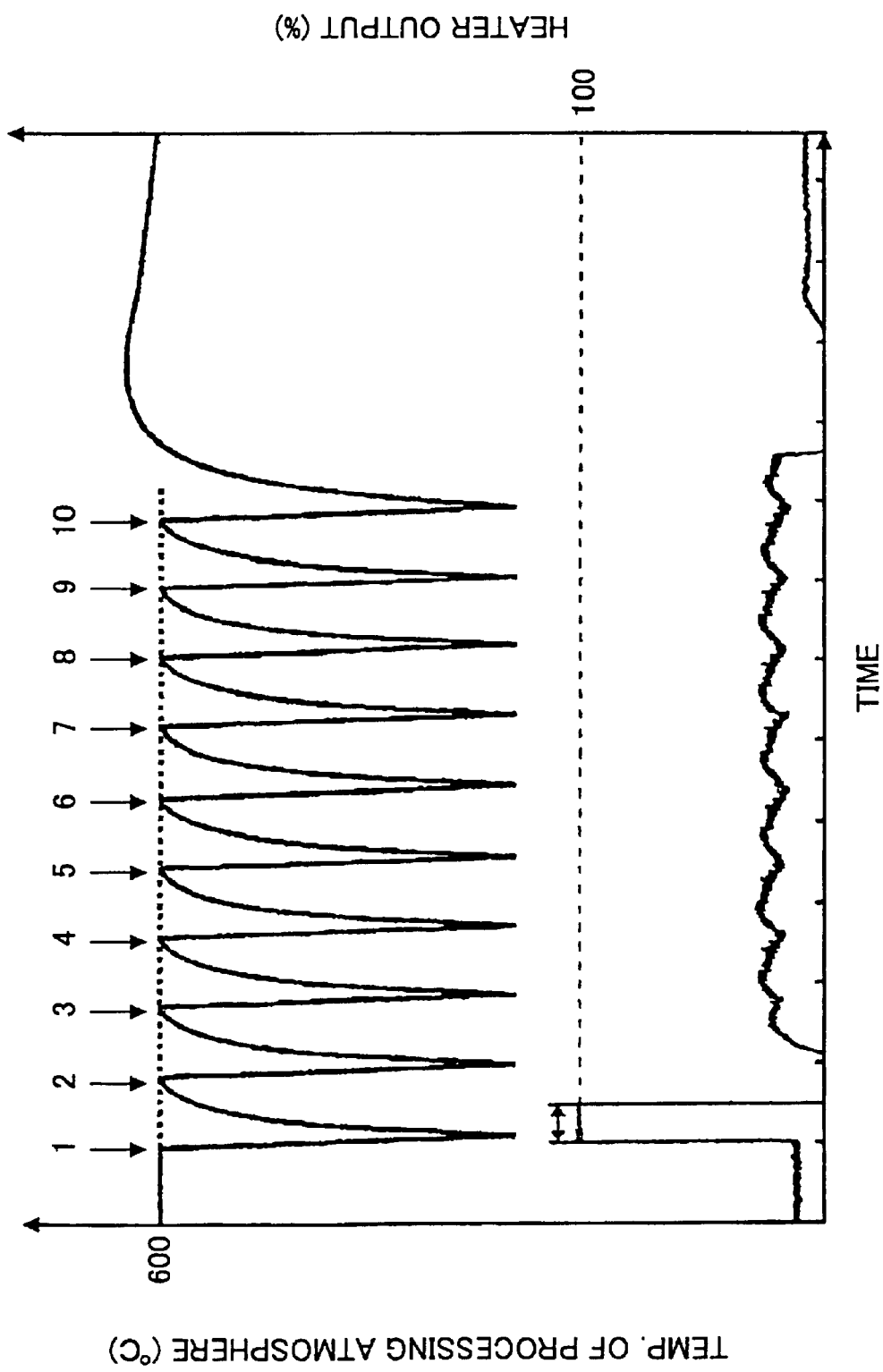

HEAT TREATMENT APPARATUS FOR PREVENTING AN INITIAL TEMPERATURE DROP WHEN CONSECUTIVELY PROCESSING A PLURALITY OF OBJECTS

BACKGROUND OF THE INVENTION

1. Field of the Invention

The present invention generally relates to a heat treatment method and apparatus and, more particularly, to a heat treatment method and apparatus for applying a heat treatment to various substrates such as, for example, a semiconductor wafer or a glass substrate for liquid crystal displays.

2. Description of the Related Art

There are various types of heat treatment apparatuses for performing an annealing process, which is one of semiconductor manufacturing processes. For example, a heat treatment apparatus of a single-wafer type such as shown in FIG. 1 is used as an apparatus used for, among annealing processes, a process for activating ions implanted in a polysilicon layer on a substrate surface. In FIG. 1, provided inside a heating furnace 1 is a reaction container 11, which is made from quartz and forms a processing atmosphere therein. A substrate placement part 12, which supports horizontally a semiconductor wafer (hereinafter referred to as a wafer) W as an object to be processed, is provided in the reaction container 11. An opening part 13 is formed on one side of the reaction container 11 of the heating furnace 1 for carrying in and out the wafer W, and a purge-gas supply pipe 14, which is connected to an interior of the reaction container 11, is provided on another side by being extended through the side wall of the heating furnace 1.

Additionally, heaters 15 (indicated by single-dashed chain lines) are provided to a ceiling part, a bottom part and side walls of the heating furnace 1 so as to surround the wafer W. A uniform-heating plate 16 is provided between the reaction container 11 and each of the heaters 15. The uniform-heating plate 16 is formed of a material such as silicon carbide (SiC) having a large heat capacity so as to diffuse heat generated by the heaters 15 and uniformly heat the entire substrate. A thermocouple 17 is provided outside the uniform-heating plate 16 so as to detect a temperature in the vicinity of the heaters 15. A value of a temperature detected by the thermocouple 17 is supplied to a control part 18 so as to adjust an amount of electric power supplied to the heaters 15 so that a surface temperature of the wafer W is maintained at a setting temperature. According to such a temperature control system, there is an advantage that a temperature control is easy.

However, in the heat treatment apparatus having the above-mentioned structure, when consecutively repeated operations are performed to carry wafers into the heating furnace 1 so as to process the wafers W and carry out the wafers W one after another, there is a problem in that the temperature inside the furnace at the time of processing the second sheet of wafers W becomes lower than the temperature at the time of processing the first sheet of wafers W. That is, although the cold wafer W carried into the reaction container 11 may reduce the temperature of the processing atmosphere inside the heating furnace 1, the temperature of the uniform-heating plate 16 hardly decreases due to its large heat capacity. For this reason, there is a delay in the detection of the temperature inside the reaction container 11 by the thermocouple 17, which is provided outside the uniform-heating plate 16, which results in that the temperature of the processing atmosphere cannot return to the setting temperature. Moreover, similarly in a heat treatment apparatus that does not have the uniform-heating plate 16, when a heat capacity of the reaction container is large, there is a delay in the detection of a temperature drop.

That is, the temperature inside the furnace cannot return to a predetermined process temperature since a response with respect to an external disturbance due to carry-in of wafers at an initial stage such as the time of carrying-in the first or second sheet of wafers. Moreover, since an increase in the wafer size has been progressed in recent years, the degree of cooling down inside the reaction container 11 becomes large at the time of carrying-in of the wafers. For the above-mentioned reasons, the temperature drop tends to be increased.

Specifically, in the example shown in FIG. 6 (a process temperature of 600° C., a process time of 60 seconds, a carry-in and carry-out time of 120 seconds), the temperature of the processing atmosphere gradually decreases from the time of processing the first wafer to the time of processing the fifth wafer, and, thereafter, the temperature stays at a temperature lower than the process temperature by 25 degrees. The range of drop of the processing temperature seen from the process temperature tends to increase as a process time A1 (time interval) per one sheet of wafers shown in the figure is reduced. If the time interval is shorter than that in the case of FIG. 6, and is set to, for example, 60 seconds, the range of temperature drop may become quite remarkable.

Moreover, there is a baking process being performed using a heating plate as measures for solving the problem due to the cold wafers at the time of heat-treating the wafers. When performing such a baking process, a heater provided in the heating plate is driven at a maximum power each time an individual wafer is placed on the heating plate, and, then, switched to an automatic temperature control state. It is known that a time period of driving the heater at the maximum power is set to a time period which is sufficient for supplying an amount of heat corresponding to an amount of heat generated by the heating plate and absorbed by the wafers. Japanese Laid-Open Patent Application No. 11-74187 discloses such a technique. Similar to a baking process for a resist film by a heating plate (hot plate), in a case where a supply of heat to wafers sensitively responds to an electric power supply to the heater, a heat treatment can be uniformly applied to each wafer. However, when a member having a large heat capacity such as a reaction container or a uniform-heating plate is interposed between the heater and the wafer, the process temperature after the process of the second sheet of wafers cannot be always equal to the process temperature at the time of processing the first sheet of wafers. Accordingly, a uniform process cannot be applied to each wafer.

SUMMARY OF THE INVENTION

It is a general object of the present invention to provide an improved and useful heat treatment method and apparatus in which the above-mentioned problems are eliminated.

A more specific object of the present invention is to provide a heat treatment method which can reduce a temperature drop when a plurality of objects to be processed are consecutively processed one after another so as to improve uniformity of process quality between the objects.

In order to achieve the above-mentioned objects, there is provided according to another aspect of the present invention a heat treatment method for continuously applying a heat treatment to a plurality of objects to be processed that are sequentially supplied to a reaction container, the heat treatment method using a heat treatment apparatus which heats the objects placed inside the reaction container by a heater provided outside the reaction container, the heat treatment method comprising the steps of: obtaining an offset temperature value which is a difference between a temperature of a processing atmosphere at a time immediately before a first one of the objects is carried into the reaction container and a temperature of the processing atmosphere at a time the temperature has become constant after the objects are subjected to a heat treatment process consecutively one after another; supplying an electric power to the heater so as to obtain a time period necessary for raising the temperature of the processing atmosphere to a temperature higher than a setting temperature for the heat treatment process by the offset temperature value; and supplying the electric power to the heater for only the time period obtained in the preceding step when the first one of the objects is carried into the reaction container, and, thereafter, performing an electric power control of the heater based on a temperature detection value of a temperature detecting part provided outside the reaction container.

There is provided according to another aspect of the present invention a heat treatment method for applying a heat treatment to a plurality of objects to be processed that are sequentially supplied to a reaction container, the heat treatment method using a heat treatment apparatus which heats the objects placed inside the reaction container consecutively one after another by a heater provided outside the reaction container at a process temperature, the heat treatment method comprising the steps of: obtaining a first relationship between a time interval and an offset temperature value, wherein the time interval is a period from a time when one of the objects is carried into the reaction container until a time when a subsequent one of the objects is carried into the reaction container and the offset temperature value is a difference between a temperature of a processing atmosphere at a time immediately before a first one of the objects is carried into the reaction container and a temperature of the processing atmosphere at a time the temperature has become constant after the objects are subjected to a heat treatment process consecutively one after another; supplying an electric power to the heater so as to raise the temperature of the processing atmosphere by the offset temperature value, and obtaining a second relationship between the offset temperature value and a time period during which the electric power has been supplied; obtaining a time period for supplying the electric power corresponding to the process temperature and the time interval based on the first relationship and the second relationship; and supplying the electric power to the heater for only the time period obtained in the preceding step when the first one of the objects is carried into the reaction container, and, thereafter, performing an electric power control of the heater based on a temperature detection value of a temperature detecting part provided outside the reaction container.

According to the heat treatment method of the present invention, before performing the electric power control (the regular electric power control) of the heater based on the temperature detection value from the temperature detection part provided outside the reaction container, the electric power is supplied to the heater for only a predetermined time so that the temperature of the processing atmosphere becomes higher than the process temperature. For this reason, for example, when consecutively performing a heat treatment on the objects to be processed, the offset temperature value can be compensated for and the process temperature to all the objects to be processed can be made uniform. Therefore, the uniformity of heat treatment between the objects to be processed is improved.

In the heat treatment method according to the present invention, a setting temperature for the electric power control of the heater performed after the electric power is supplied to the heater may correspond to a temperature calculated by adding the offset temperature value to the temperature for the heat treatment process. Additionally, the electric power may be supplied to the heater based on a control signal supplied from an outside of a feedback control loop using the temperature detection value. Further, a uniform-heating member, which serves to uniformly heat the reaction container, may be provided between the reaction container and the heater.

There is provided according to another aspect of the present invention a heat treatment apparatus for heating a plurality of objects to be processed consecutively one after another, the objects being placed inside a reaction container and heated by a heater provided outside the reaction container at a process temperature, the heat treatment apparatus comprising: a first memory part storing a first relationship between a time interval and an offset temperature value in relation to the process temperature, wherein the time interval is a period from a time when one of the objects is carried into the reaction container until a time when a subsequent one of the objects is carried into the reaction container and the offset temperature value is a difference between a temperature of a processing atmosphere within the reaction container at a time immediately before a first one of the objects is carried into the reaction container and a temperature of the processing atmosphere at a time the temperature has become constant after the objects are subjected to a heat treatment process consecutively one after another; a second memory part storing, in relation to the process temperature, a second relationship between the offset temperature value and a time period during which an electric power is supplied to the heater so as to raise the temperature of the processing atmosphere by the offset temperature value; means for obtaining a time period for supplying the electric power corresponding to the process temperature and the time interval based on the first relationship and the second relationship; a temperature detecting part provided outside the reaction container; and a control part supplying the electric power to the heater for only the time period obtained by the means when the first one of the objects is carried into the reaction container, and, thereafter, performing an electric power control of the heater based on a temperature detection value of the temperature detecting part.

The heat treatment apparatus according to the present invention may comprise a program for creating the first relationship and the second relationship. Additionally, the electric power may be supplied to the heater based on a control signal supplied from an outside of a feedback control loop using the temperature detection value. The heat treatment apparatus according to the present invention may further comprise a uniform-heating member, which serves to uniformly heat the reaction container and provided between the reaction container and the heater. Additionally, the objects to be processed may be substrates; a conveyance opening for the substrates may be provided on a side of the reaction container; and the heater may be configured and arranged to heat both sides of each substrate.

Other objects, features and advantages of the present invention will become more apparent from the following detailed description when read in conjunction with the accompanying drawings.

BRIEF DESCRIPTION OF THE DRAWINGS

FIG. 9 is a graph showing a result of test performed to obtain the second relationship;

FIG. 10 is a graph showing a temperature of the processing atmosphere when a plurality of wafers are subjected to a heat treatment sequentially.

DETAILED DESCRIPTION OF THE PREFERRED EMBODIMENTS

A description will now be given of a heat treatment apparatus according to a first embodiment of the present invention.

Figure 1:
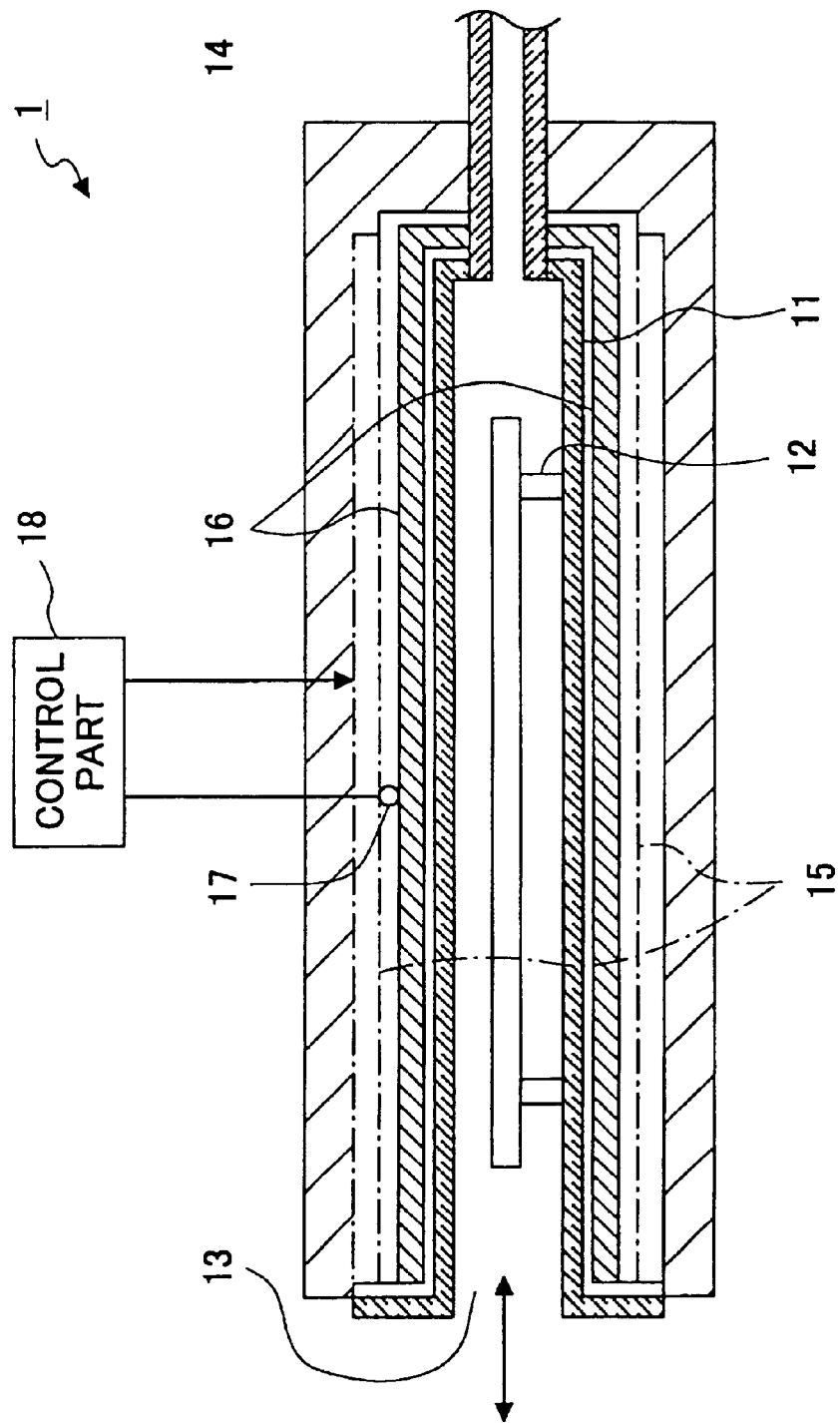
FIG. 1 is a cross-sectional view of a conventional heat treatment apparatus.
Figure 2:
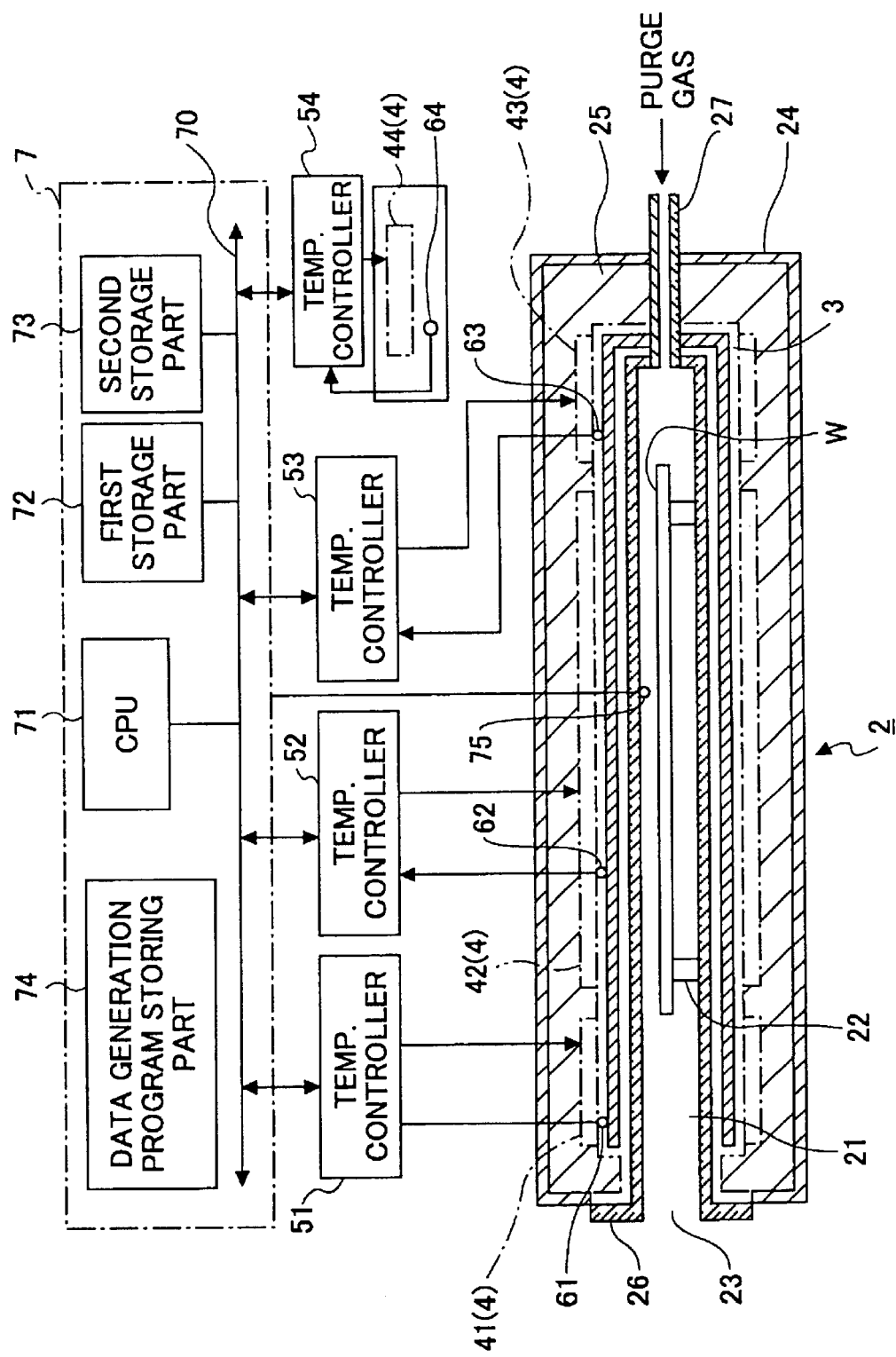
FIG. 2 is a cross-sectional view of a heat treatment apparatus according to a first embodiment of the present invention.
Figure 3:
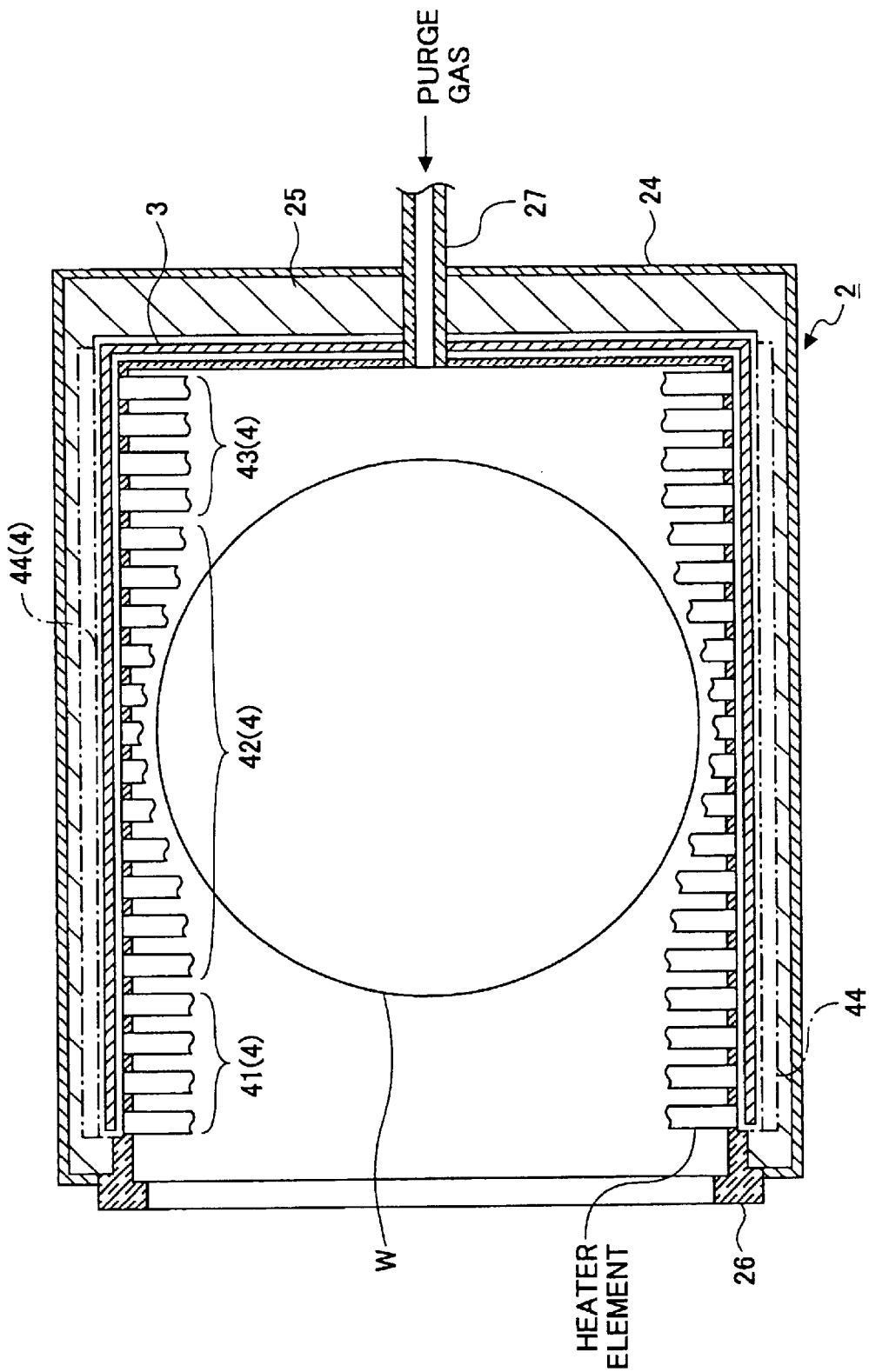
FIG. 3 is a plan view of the heat treatment apparatus according to the first embodiment of the present invention.

First, a description will be given, with reference to FIG. 2 and FIG. 3, of an entire structure of the heat treatment apparatus according to the first embodiment of the present invention. FIG. 2 is a cross-sectional view of the heat treatment apparatus according to the present embodiment. FIG. 3 is a plan view of the heat treatment apparatus according to the present embodiment. The heat treatment apparatus according to the present embodiment has a heating furnace 2 having an appearance of a box shape. A processing atmosphere 21 is formed inside the heating furnace 2, and a placement part 22 is provided so as to support a wafer W, which is an object to be processed, in a substantially horizontal position. An opening 23 for carrying-in and carrying-out the wafer W is formed on one side of the heating furnace 2 so that the wafer W can be transferred between, for example, a substrate conveyance arm (not shown in the figure) and the placement part 22.

An outer surface of the heating furnace 2 is covered in its entirety by a sheath member 24, which is made of aluminum, for example. There is provided an insulating material 25 inside the heating furnace 2. Additionally, a reaction container 26 is provided in the heating furnace 2. The reaction container 26 is made of quartz, for example, and having a flat box-shape so as to form the processing atmosphere 21 therein. An end of a gas supply pipe 27, which is made of quartz, is connected to the reaction container 26. The other end of the gas supply pipe 27 is connected to a purge-gas source (not shown in the figure) by being extended through the sidewall of the heating furnace 2 so as to supply a purge gas such as $N_2$ into the processing atmosphere 21 during a process time.

A box-shaped uniform-heating member 3, which is made of a material having a large heat capacity such as silicon carbide (SiC), is provided outside the reaction container 26 so as to surround the reaction container 26. Since the uniform-heating member 3 is a plate member when seen from each surface, it will be hereinafter referred to as a uniform-heating plate 3. A heater 4, which is made of a resistance-heating element, is provided outside the uniform-heating plate 3 via a gap therebetween. The heater 4 includes a front heater 41, a central heater 42 and a rear heater 43 so that the processing atmosphere 21 is divided into three zones along the carrying-in direction of the wafer W and a temperature of each zone can be controlled individually. Additionally, the heater 4 further includes side heaters 44 on each side of the reaction container 26. It should be noted that although a heater element, which has a carbon fiber enclosed in a quartz tube, can be used as each of the heaters 41–44 in practice, the heaters are indicated as areas encircled by single-dashed chain lines in the figure for the sake of convenience. Moreover, heaters 41–44 are controlled based on a pair of heater elements, which are located in opposite areas. For example, when the front heater 41, the central heater 42 and the rear heater 43 are concerned, the two heater elements provided on the top surface and the bottom surface of the reaction container 26 make a pair and pairs of heater elements are controlled by temperature controllers 51, 52 and 53, respectively. Additionally, the side heaters 44 are controlled by a temperature controller 54.

Between the uniform-heating plate 3 and each of the heaters 41–44, there are provided thermocouples 61–64 which form temperature detecting parts to detect temperatures in the vicinity of each of the heaters 41–44, and the thermocouples 61–64 are connected to the temperature controllers 51–54, respectively. The temperature controllers 51–54 are connected to a process controller 7.

Figure 4:
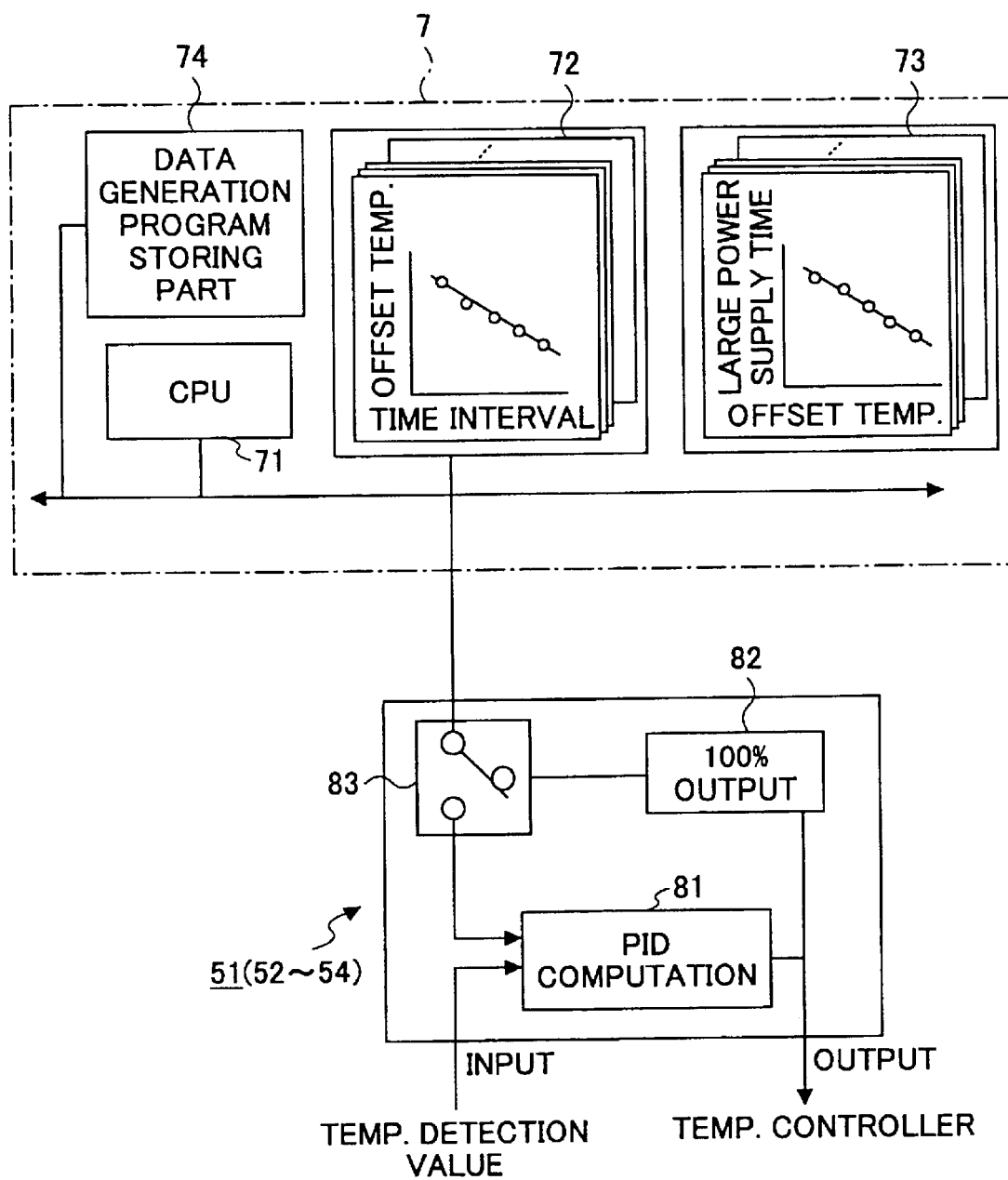
FIG. 4 is a block diagram of a control system provided in the heat treatment apparatus shown in FIG. 2.

Each of the temperature controllers 51–54 controls independently a corresponding one of the heaters 41–44 based on a setting signal sent from the process controller 7 and a temperature setting value supplied from a corresponding one of the temperature detecting parts. Since a control to supply a large electric power is performed prior to carrying-in the first wafer as mentioned later with respect to each of the heaters 41–44, the process controller is constituted as shown in FIG. 4. That is, each of the heaters 41–44 is provided with a PID operation part 81 serving as a first output part, a large electric power supply output part 82 serving as a second output part, and a switching part 83. The PID operation part 81 performs a PID (proportional integration and differentiation) control by being provided with a temperature setting value sent from the process controller and assigned thereto and a temperature detection value sent from a corresponding one of the temperature detection parts. The large electric power supply output part 82 outputs a control signal so that a 100%-output is supplied from an electric power supply part (not shown in the figure) to each of the heaters 41–44. The switching part 83 switches the supply of the setting signal from the process controller between the PID operation part 81 and the large electric power supply output part 82.

The process controller 7 is provided with a CPU (central processing unit) 71, a first memory part 72, a second memory part 73, and a data generation program storing part 74. The first memory part 72 stores data indicating the relationship (first relationship) between the time interval and the offset temperature value for each process temperature. The time interval corresponds to a time period from a time of carrying a wafer W into the heating furnace 2 until a time of carrying a subsequent wafer W into the heating furnace 2. The offset temperature value corresponds to a difference which is obtained by subtracting a temperature of the processing atmosphere at which the processing atmosphere becomes constant from a temperature of the processing atmosphere immediately before the first wafer W is carried into the heating furnace 2 when a plurality of wafers W are consecutively processed in the heating furnace 2. The second memory part 13 stores data indicating the relationship (second relationship) between a time period for the output of the large electric power supply output part 82, that is, a time period for supplying a large electric power to each of the heaters 41–44 and the offset temperature value which increases in response to the time period concerned.

A program stored in the data generation program storing part 74 is for creating the data representing the first relationship, which is stored in the first memory part 72 prior to processing the wafers, and the data representing the second relationship, which is stored in the second memory part 73 prior to processing the wafers. Each data representing the first relationship and the second relationship is for determining a length of the time period for supplying the 100%-output, which is a large electric power (electric power for initial temperature rising), from the electric power supply part (not shown in the figure) to each of the heaters 41–44 immediately before carrying the first wafer W into the heating furnace 2 in a certain process. The data is created based on the temperature of the central zone in the reaction container 26, and the supply time of the large electric power obtained based on the data is made common to each of the heaters 41–44. Additionally, each part of the process controller 7 is connected to each of the temperature controllers 51–54 through a bus 70.

A description will now be given of an operation of the heat treatment apparatus according to the present embodiment. Here, the outline of the flow of the operation is explained briefly. First, the first memory part 72 and the second memory part 73 acquire the data to be stored therein. Then, a heat treatment is applied to the wafer W in accordance with the data stored in the first memory part 72 and the second memory part 73. The following explanation follows this order.

Figure 5:
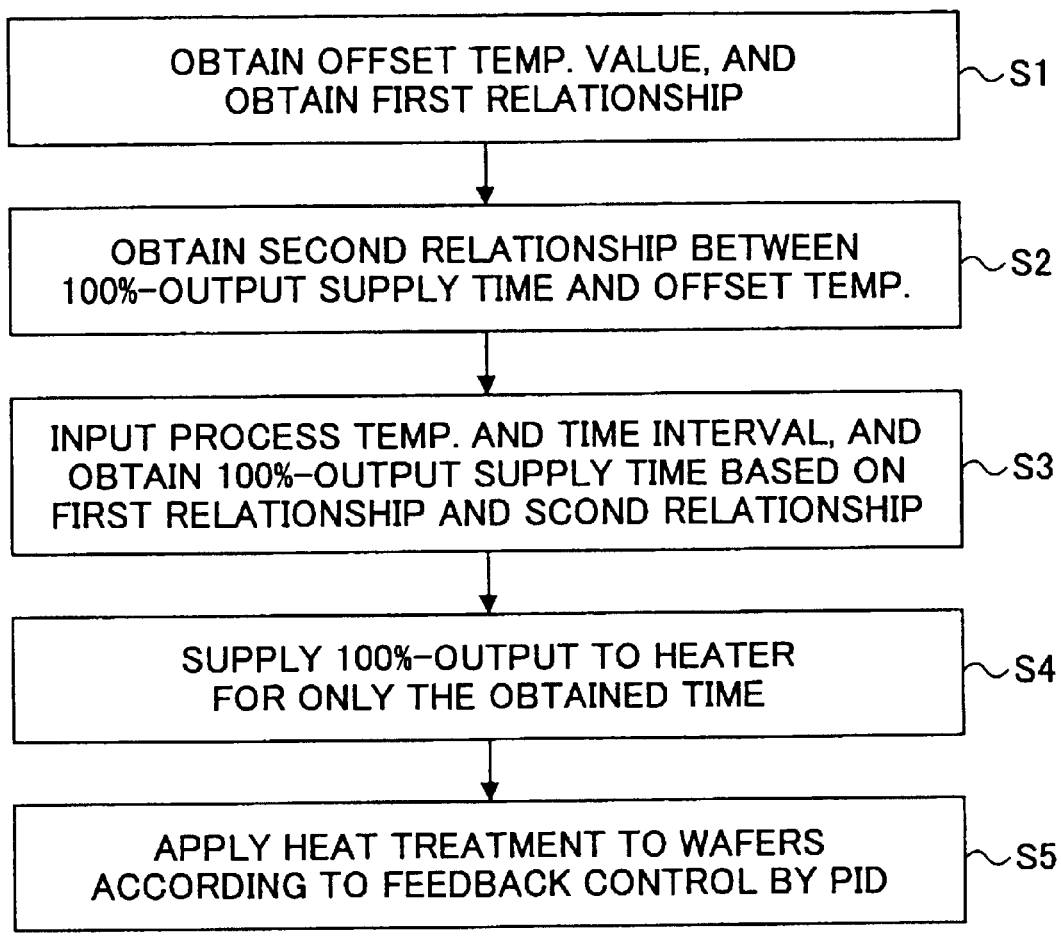
FIG. 5 is a flow chart of an operation performed by the heat treatment apparatus shown in FIG. 2.

First, as shown in FIG. 5, the first relationship between the time interval and the offset temperature value is acquired for various process temperatures, and the first relationship is stored, in step S1, in the first memory part 72. At this time, since the switching part 83 in the temperature controllers 51–54 have been switched to the side of the PID operation part 81, the control of the amount of electric power supplied to the heaters 41–44 is performed by a feedback control part based on a control signal which is obtained by inputting each temperature setting value sent from the process controller 7 and the temperature detection value obtained from the thermocouples 61–64.

Figure 6:
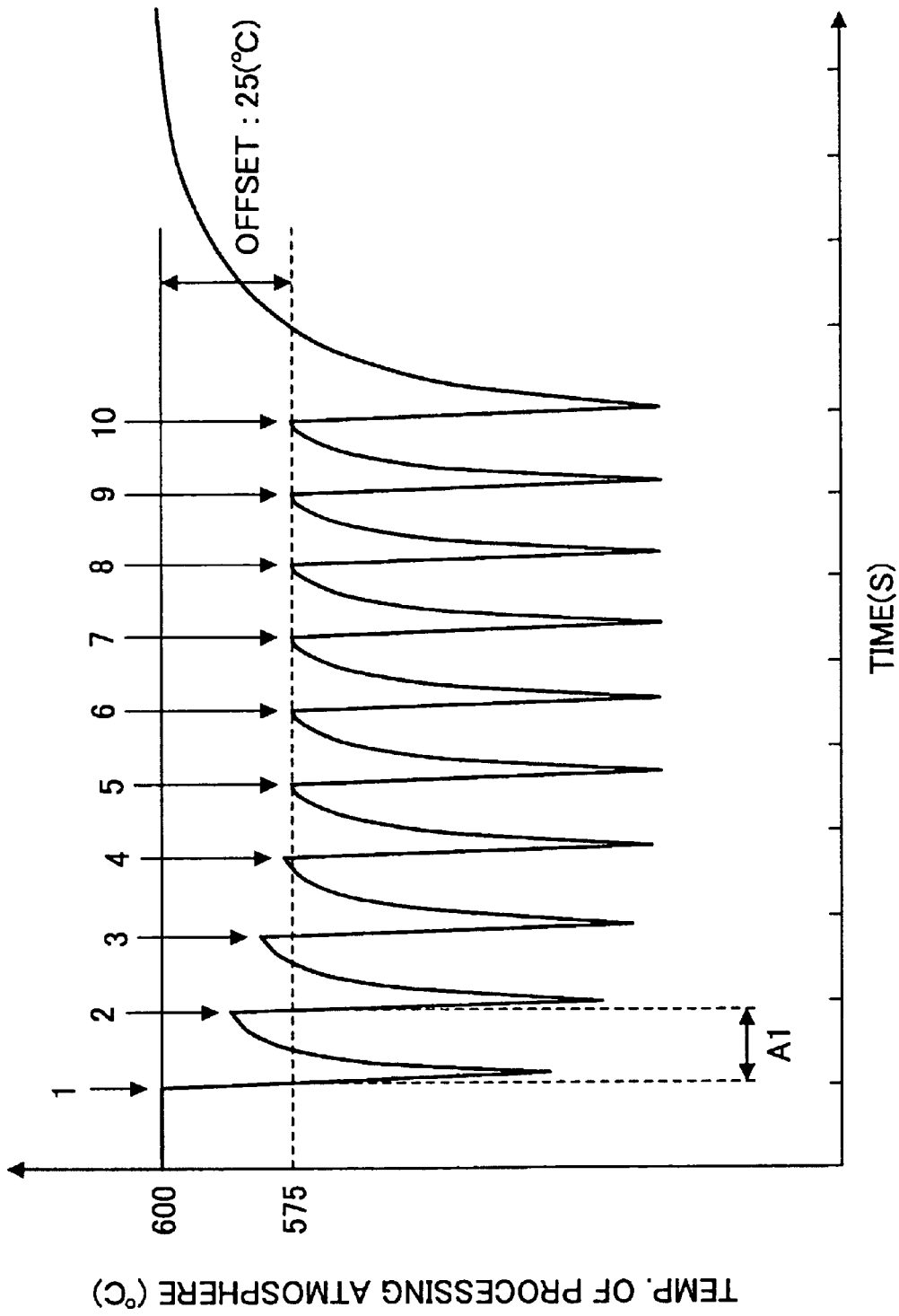
FIG. 6 is a graph showing a result of test performed to obtain a first relation ship.

FIG. 6 is a graph showing variations in the temperature inside the processing atmosphere 21 in a case where the wafers W are consecutively processed. The temperature inside the processing atmosphere 21 can be represented by the temperature detection values from an internal thermocouple 75 provided at a central section of the reaction container 26 shown in FIG. 2. As shown in FIG. 6, while processing a plurality of sheets of wafers, the temperature inside the reaction container 26 drops gradually. For example, when the process temperature is set to 600° C. and ten wafers W are processed consecutively, as shown in FIG. 6, the temperature inside the process container 26 becomes constant at 575° C. which is 25 degrees lower than the process temperature as shown in FIG. 6.

Figure 7:
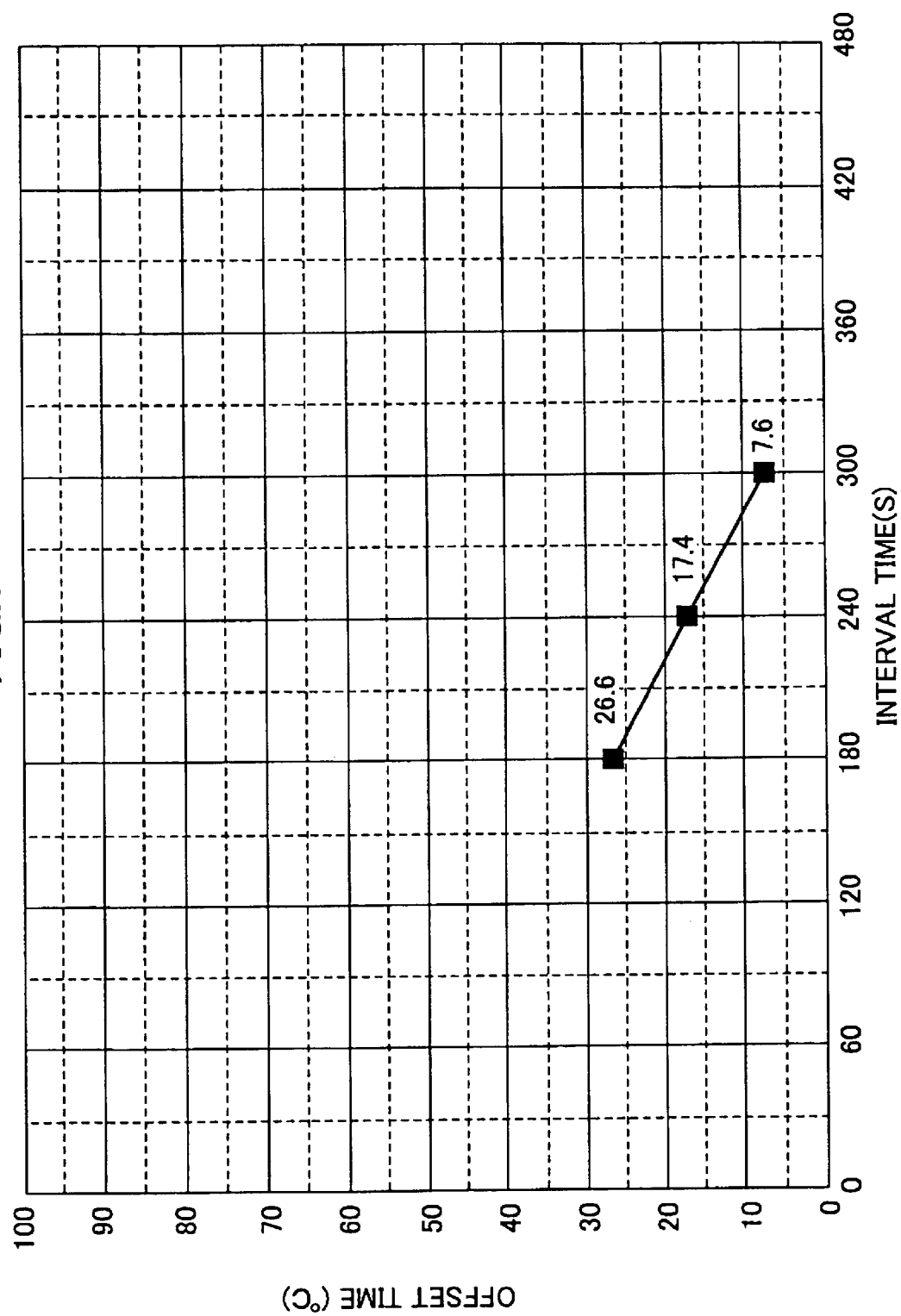
FIG. 7 is a graph showing a result of test performed for obtaining the first relationship.
Figure 8:
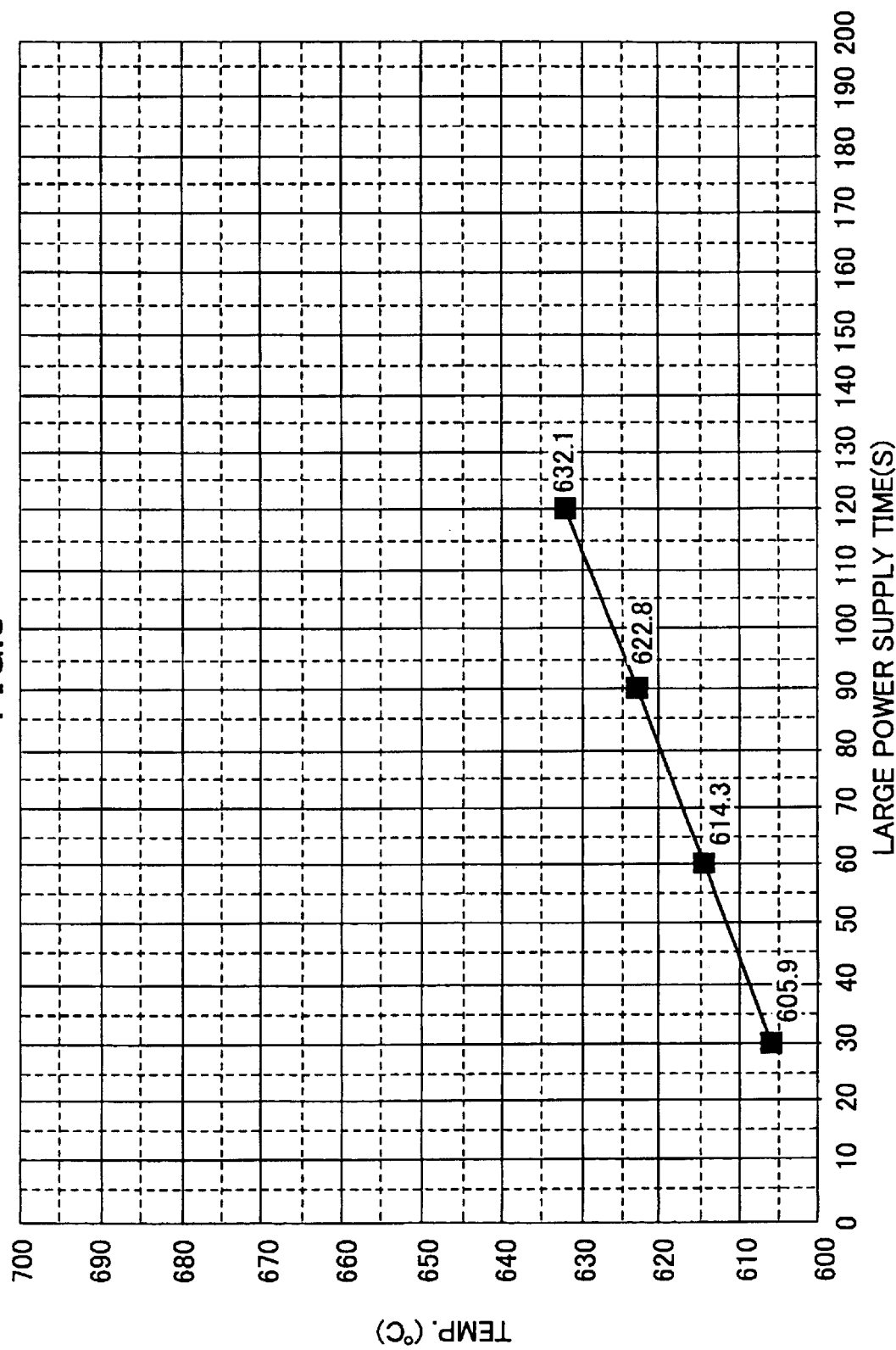
FIG. 8 is a graph showing a result of test performed to obtain a second relationship.

The value of 25 degrees corresponds to the offset temperature value of the case where the heat treatment is performed with the process temperature being set to 600° C. By performing the above-mentioned measurement operation of the offset temperature value while varying the time interval indicated by A1 in FIG. 6, it is possible to obtain a relationship (first relationship) between the offset temperature value and the time interval as shown in FIG. 7, for example. It should be noted that the time interval is a period from a time when the nth wafer W is started to be carried into the reaction container 26 to a time when the (n+1)th wafer W is started to be carried into the reaction container 26.

The first relationship data shown in FIG. 7 is obtained by plotting the offset temperature values when the process temperature is 600° C. and varying the time interval three times such as 180 seconds, 240 seconds and 300 seconds. The setting value of the time interval and the number of measurements may be changed freely. Then, the data obtaining operation is performed with respect to various process temperatures, and the thus-obtained data with respect to the relationship between the offset temperature value and the time interval is stored in the first memory part 72.

Then, the second relationship between the offset temperature value and the period for supplying the 100%-output to the heaters 41–44 is obtained in step S2. The second relationship is used when determining a time period during which each controller 51–54 uses the large electric power supply output part 82 when applying a heat treatment on the wafer product W mentioned later. Specifically, the switching part 83 of the temperature controllers 51–54 is switched to the side of the large electric power supply output part 82 in a state where the temperature detection value of the internal thermocouple 75 is stable, and the temperature of the processing atmosphere is raised stepwisely. It should be noted that the wafer W is not carried in the heating furnace when acquiring the second relationship. After a certain time A2 has passes, each electric power supply is turn to zero (switched to the PID operation part 81, and a setting signal is changed to "zero"), and observes how much the temperature detection value of the internal thermocouple 75 rises. The relationship between the A2 and the temperature-rise value can be obtained by varying the time A2. Since the temperature-rise value serves to stabilize the temperature inside the reaction container at the process temperature by canceling the offset temperature value when the wafer W is carried into the heating furnace 2, the relationship corresponds to the relationship between the offset temperature value and the 100%-output time as shown, for example, in FIG. 7. It should be noted that the vertical axis of the graph shown in FIG. 7 represents a temperature, which is obtained by adding the temperature-rise value to the process temperature.

The process of the above-mentioned steps S1 and S2 is performed prior to performing the heat treatment process. Additionally, as shown in FIG. 4, the process of step S3 is also performed. That is, the timing of consecutive carry-in of the wafers W, the predetermined time interval and the process temperature are input to an input part (not shown) of the process controller 7. Based on the input, the process controller 7 selects the second relationship corresponding to the concerned process temperature stored in the first memory part 72 so as to obtain the offset temperature value from the time interval and the first relationship. Further, the process controller 7 selects the second relationship corresponding to the concerned process temperature stored in the second memory part 73 so as to obtain the 100%-output supply time based on the relationship between the offset temperature value and the second relationship. In this example, since the time interval is 190 seconds, the offset temperature is 25 degrees and the above-mentioned supply time is 95.6 seconds.

After the setting is completed, the heat treatment process is performed actually. At first, the inside of the heating furnace 2 is set to the process temperature of 600° C. In this state, the heat treatment (for example, annealing process) is performed from the second sheet of wafers W. When carrying in the first sheet of the wafers W, the output is switched to 100%-output in each of the controllers 51–54 when the carry-in operation of the wafer W to the heating furnace 2 is completed. Then, in step S4, 100%-output is supplied to the heaters 41–44 only for the setting time, and the temperature setting value is set to a value, which is a sum of the process temperature and the offset temperature value. Thereafter, in step S5, a regular PID control is performed. Here, before explaining about the temperature in the heating furnace 2 when carrying-in the wafer W, a description will be given of the temperature control and the temperature inside the heating furnace 2 with reference to FIG. 9. As can be interpreted from the figure, if 100%-output is supplied to the heaters 41–46 in a state in which the inside temperature of the heating furnace 2 is stabilized at 600° C., the temperature inside the heating furnace 2 rises to 625° C. which is a value of a sum of the process temperature of 600° C. and the offset temperature value. Then, the switching part 83 is switched to the side of the PIS operation part 81 when it reaches 625° C. Simultaneously, the temperature setting value corresponding to the process temperature of 625° C. is supplied from the process controller to each of the temperature controllers 51–54 so as to perform the regular PID operation. Since the temperature setting value is 625° C. thereafter and the temperature setting value when the second sheet of wafers W is carried-in is also 625° C., the temperature of the processing atmosphere at the time of carrying-in the second sheet of wafers W is maintained constant at 625° C.

FIG. 10 is a graph showing the temperature (temperature detection value of the internal thermocouple 75) of the processing atmosphere 21 when the wafers W are subjected to the heat treatment sequentially from the first sheet to the tenth sheet. Although the temperature in the heating furnace 2 tends to drop since the wafers are cold, the temperature is maintained at the process temperature since the 100%-output, which is a large electric power, is supplied to the heaters 41–44 as shown in FIG. 9. After the second sheet of wafers W is sequentially carried into the heating furnace 2, the temperature inside the heating furnace 2 tends to drop again. However, a large electric power including the estimated temperature drop is supplied to the heaters 41–44, and the amount of heat of the heaters is supplied inside the heating furnace 2 through the uniform-heating plate 3. Therefore, a limit control is performed with a temperature setting value which corresponds to a value obtained by adding the temperature drop value (offset temperature value) to the process temperature. Consequently, the temperature for heat treatment of each of the wafers W is maintained constant. It should be noted that the power supply to the heater 4 is turn to 0 at the timing of carrying in the last wafer W, the temperature gradually decreases, and an output control is performed again by the PID operation part 81 so that the temperature of the processing atmosphere 21 is set to the process temperature. Accordingly, the temperature of the processing atmosphere gradually converges to the process temperature.

As explained so far, according to the present embodiment, a switching of an output determining part is performed before the PID control based on the temperature near the heaters 41–44 so that an electric power is supplied to the heaters with 100%-output, for example, for a predetermined time. Regarding the switching timing between both, since the previously prepared first and second relationships are referred to, the temperature drop of the processing atmosphere at the time of carrying-in of the wafer W can be compensated for. Moreover, since all of the wafers W which are consecutively processed can be heat-treated at the same process temperature, the uniformity of the heat treatment between the wafers W is improved. In addition, in order to carry out the temperature control of the processing atmosphere, it can also be considered to use a temperature control system provided with a thermocouple inside the reaction container 11. In this case, since the temperature detection value fluctuates while loading the wafer W, the control may be complex so as to stabilize the temperature at the process temperature. Additionally, since the temperature of the part in which the thermocouple is located, and the temperature of wafer W are not always equal to each other, the method of the above-mentioned embodiment is superior to the method using the thermocouple provided inside the reaction container. In the present invention, when carrying the first wafer W into the heating furnace 2, a switching is performed to the 100%-output in each of the temperature controllers 51–54 so as to supply the output to the heaters 41–44 for only a predetermined time. The timing for switching to the 100%-output, that is, "the time at which the first wafer W is carried into the heating furnace 2" is not limited to the time of completion of the carry-in of the first wafer W into the heating furnace 2, and may be a time when the first wafer W reaches the entrance of the heating furnace 2. Namely, the timing may be defined as a timing by which the temperature is stabilized at or near a temperature (for example, 600° C.) expected to be achieved when the predetermined time has passed after switched to the 100%-output. Moreover, although the switching part 83 is switched to the side of the large electric power supply output part 82 so as to supply the 100%-output to the heaters when a large electric power is supplied to the heaters 41–44, the temperature setting value of the PID operation part 81 may be set to the maximum, for example, or a large electric power may be supplied by other techniques. It should be noted that the output value of the large electric power is not limited to 100%. Moreover, although the uniform-heating plate is provided in the above-mentioned embodiment, the present invention is applicable to a case which is not provided with the uniform-heating plate. Moreover, the present invention is suitable for an apparatus having a reaction container made of a material having a large heat capacity such as, for example, silicon carbide or the like.

Further, the present invention is not limited to the technique which obtains the above-mentioned first and second relationship. The present invention includes a case in which the offset temperature value is obtained by using a previously prepared dummy wafer and obtaining a time for supplying a large electric power to raise the temperature from the process temperature to a temperature which is a sum of the process temperature and the offset temperature value so as to perform a process using the thus obtained time for supplying the large electric power.

Moreover, the objects to be processed are not limited to semiconductor wafers, and, for example, a glass substrate for liquid crystal displays, etc. may be used.

The present invention is not limited to the specifically disclosed embodiments, and variations and modifications may be made without departing from the scope of the present invention.

What is claimed is:

1. A heat treatment method for continuously applying a heat treatment to a plurality of objects to be processed that are sequentially supplied to a reaction container, the heat treatment method using a heat treatment apparatus which heats the objects placed inside the reaction container by a heater provided outside the reaction container, the heat treatment method comprising the steps of:

obtaining an offset temperature value which is a difference between a temperature of a processing atmosphere at a time immediately before a first one of the objects is carried into the reaction container and a temperature of the processing atmosphere at a time the temperature has become constant after the objects are subjected to a heat treatment process consecutively one after another;

supplying an electric power to the heater so as to obtain a time period necessary for raising the temperature of the processing atmosphere to a temperature higher than a setting temperature for the heat treatment process by the offset temperature value; and supplying the electric power to the heater for only the time period obtained in the preceding step when the first one of the objects is carried into the reaction container, and, thereafter, performing an electric power control of the heater based on a temperature detection value of a temperature detecting part provided outside the reaction container.

2. The heat treatment method as claimed in claim 1, wherein a setting temperature for the electric power control of the heater performed after the electric power is supplied to the heater corresponds to a temperature calculated by adding the offset temperature value to the temperature for the heat treatment process.

3. The heat treatment method as claimed in claim 1, wherein the electric power is supplied to the heater based on a control signal supplied from an outside of a feedback control loop using the temperature detection value.

4. The beat treatment method as claimed in claim 1, wherein a uniform-heating member, which serves to uniformly heat the reaction container, is provided between the reaction container and the heater.

5. A heat treatment method for applying a heat treatment to a plurality of objects to be processed that are sequentially supplied to a reaction container, the heat treatment method using a heat treatment apparatus which heats the objects placed inside the reaction container consecutively one after another by a heater provided outside the reaction container at a process temperature, the heat treatment method comprising the steps of:

obtaining a first relationship between a time interval and an offset temperature value, wherein the time interval is a period from a time when one of the objects is carried into the reaction container until a time when a subsequent one of the objects is carried into the reaction container and the offset temperature value is a difference between a temperature of a processing atmosphere at a time immediately before a first one of the objects is carried into the reaction container and a temperature of the processing atmosphere at a time the temperature has become constant after the objects are subjected to a heat treatment process consecutively one after another;

supplying an electric power to the heater so as to raise the temperature of the processing atmosphere by the offset temperature value, and obtaining a second relationship between the offset temperature value and a time period during which the electric power has been supplied;

obtaining a time period for supplying the electric power corresponding to the process temperature and the time interval based on the first relationship and the second relationship; and supplying the electric power to the heater for only the time period obtained in the preceding step when the first one of the objects is carried into the reaction container, and, thereafter, performing an electric power control of the heater based on a temperature detection value of a temperature detecting part provided outside the reaction container.

6. The heat treatment method as claimed in claim 5, wherein a setting temperature for the electric power control of the heater performed after the electric power is supplied to the heater corresponds to a temperature calculated by adding the offset temperature value to the temperature for the heat treatment process.

7. The heat treatment method as claimed in claim 5, wherein the electric power is supplied to the heater based on a control signal supplied from an outside of a feedback control loop using the temperature detection value.

8. The heat treatment method as claimed in claim 5, wherein a uniform-heating member, which serves to uniformly heat the reaction container, is provided between the reaction container and the heater.

9. A heat treatment apparatus for heating a plurality of objects to be processed consecutively one after another, the objects being placed inside a reaction container and heated by a heater provided outside the reaction container at a process temperature, the heat treatment apparatus comprising:

a first memory part storing a first relationship between a time interval and an offset temperature value in relation to the process temperature, wherein the time interval is a period from a time when one of the objects is carried into the reaction container until a time when a subsequent one of the objects is carried into the reaction container and the offset temperature value is a difference between a temperature of a processing atmosphere within the reaction container at a time immediately before a first one of the objects is carried into the reaction container and a temperature of the processing atmosphere at a time the temperature has become constant after the objects are subjected to a heat treatment process consecutively one after another;

a second memory part storing, in relation to the process temperature, a second relationship between the offset temperature value and a time period during which an electric power is supplied to the heater so as to raise the temperature of the processing atmosphere by the offset temperature value;

means for obtaining a time period for supplying the electric power corresponding to the process temperature and the time interval based on the first relationship and the second relationship;

a temperature detecting part provided outside the reaction container; and a control part supplying the electric power to the heater for only the time period obtained by the means when the first one of the objects is carried into the reaction container, and, thereafter, performing an electric power control of the heater based on a temperature detection value of the temperature detecting part.

10. The heat treatment apparatus as claimed in claim 9, comprising a program for creating the first relationship and the second relationship.

11. The heat treatment apparatus as claimed in claim 9, wherein the electric power is supplied to the heater based on a control signal supplied from an outside of a feedback control loop using the temperature detection value.

12. The heat treatment apparatus as claimed in claim 9, further comprising a uniform-heating member, which serves to uniformly heat the reaction container and provided between the reaction container and the heater.

13. The heat treatment apparatus as claimed in claim 9, wherein the objects to be processed are substrates; a conveyance opening for the substrates is provided on a side of the reaction container; and the heater is configured and arranged to heat both sides of each substrate.

* * * * *